(12) United States Patent
Kuhara et al.

(10) Patent No.: US 6,798,932 B2
(45) Date of Patent: Sep. 28, 2004

(54) PARALLEL LIGHT EMITTING DEVICE—PHOTOSENSITIVE DEVICE MODULE

(75) Inventors: Yoshiki Kuhara, Osaka (JP); Naoyuki Yamabayashi, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/354,668

(22) Filed: Jan. 30, 2003

(65) Prior Publication Data

US 2003/0152391 A1 Aug. 14, 2003

(30) Foreign Application Priority Data

Feb. 13, 2002 (JP) ........................................ 2002-035177

(51) Int. Cl.[7] ................................................ G02B 6/12
(52) U.S. Cl. ............................ 385/14; 385/88; 385/129
(58) Field of Search ............................. 385/14, 42, 48, 385/88, 92, 129–132

(56) References Cited

U.S. PATENT DOCUMENTS

| | | | |
|---|---|---|---|
| 6,236,669 B1 * | 5/2001 | Nakanishi et al. ............ | 372/43 |
| 6,530,698 B1 * | 3/2003 | Kuhara et al. ................ | 385/88 |
| 6,567,590 B1 * | 5/2003 | Okada et al. ................. | 385/49 |
| 6,575,641 B2 * | 6/2003 | Yamabayashi et al. ....... | 385/88 |
| 6,590,686 B1 * | 7/2003 | Sekiya et al. ................ | 398/183 |

FOREIGN PATENT DOCUMENTS

JP        11-68705        3/1999

OTHER PUBLICATIONS

M. Shishijura, K. Nagatsuma, T. Ido, M. Tokuda, K. Nakahara, E. Nomoto, T. Sudoh and H. Sano, "10Gbps X 4–channel parallel LD module", Proceeding of the 2001 Communications Society Conference of IEICE, C–3–50, P160 (2001).

* cited by examiner

*Primary Examiner*—Michael G. Lee
*Assistant Examiner*—Seung H Lee
(74) *Attorney, Agent, or Firm*—Fish & Richardson P.C.

(57) ABSTRACT

A multichannel parallel LD/PD module comprising a bench, a plurality of lightpaths having an initial narrow width region, an intermediate width enlarging region and a final wide width region, a plurality of photodiodes or a photodiode array mounted on the narrow width region, a wavelength selective filter formed on the narrow width region for selectively reflecting receiving beams, a plurality of light emitting devices fitted behind rear ends of the lightpaths on the bench. Traveling in element fibers in an outer ribbon fiber, receiving signal beams go into the lightpaths via front ends and are reflected by the wavelength selective filter slantingly upward at the narrow width region. The reflected beams go into the photodiodes and are converted into photocurrents in proportion to the receiving signals. Emanating from the light emitting devices, transmitting signal beams enter the lightpaths via final ends of the wide width region, propagate backward in the width enlarging region, arrive at the narrow width region, transfer to outer element fibers in a connector, and propagate in the ribbon fiber following the connector. Long distances between the transmitting portion (LDs or LEDs) and the receiving portion (PDs) suppress optical, electromagnetic and electric crosstalk between the light emitting devices and the photodiodes.

20 Claims, 8 Drawing Sheets

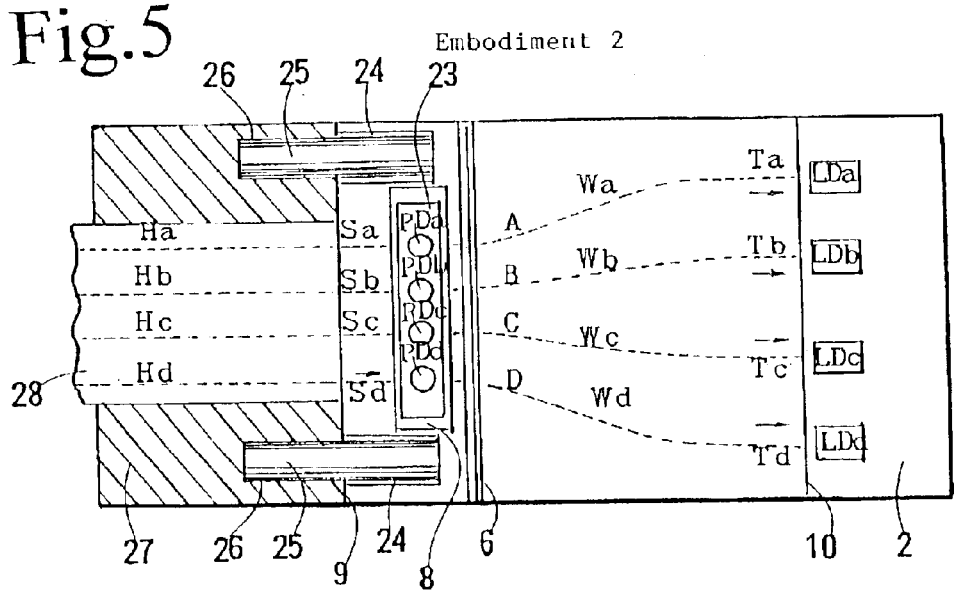
Fig.5 Embodiment 2
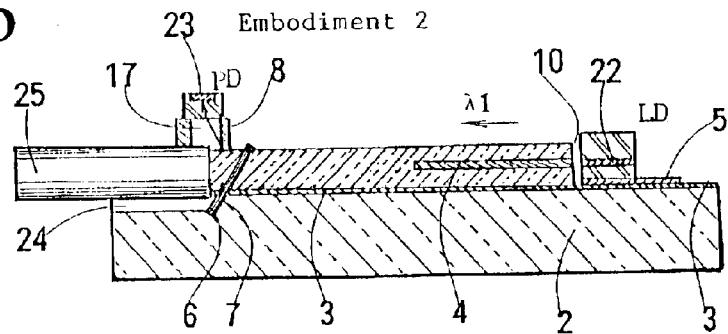
Fig.6 Embodiment 2
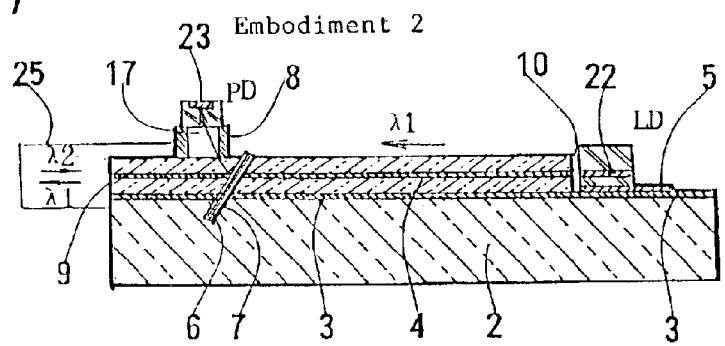
Fig.7 Embodiment 2

Embodiment 5

Embodiment 5

PARALLEL LIGHT EMITTING DEVICE— PHOTOSENSITIVE DEVICE MODULE

BACKGROUND OF THE INVENTION

1. Field of the Invention

This invention relates to a parallel LD/PD module which transmits and receives a plurality of optical signals via a plurality of channels. A parallel communication system transmits optical signals of four, eight, sixteen or, in general, $2^m$ (m=integer) channels via a tape fiber including parallel individual M element fibers (M=$2^m$). A single-mode fiber has a 125 μm cladding diameter. A standard tape fiber arrays individual element fibers at a 250 μm pitch.

This invention claims the priority of Japanese Patent Application No. 2002-35177 filed on Feb. 13, 2002, which is incorporated herein by reference.

A laser diode chip has at least a 300 μm length and a 300 μm width. A parallel LD module should have M laser diodes (LDs). If lightpaths were formed in a parallel LD module at a 250 μm pitch, the virtual module could not allot laser diodes having sides longer than 300 μm at ends of the 250 μm pitch lightpaths.

2. Description of Related Art

① M. Shishikura, K. Nagatsuma, T. Ido, M. Tokuda, K. Nakahara, E. Nomoto, T. Sudoh and H. Sano, "10 Gbps×4-channel parallel LD module", Proceeding of the 2001 Communications Society Conference of IEICE, C-3-50, p160 (2001)

This pointed out problems of multichannel LD modules which contain a plurality of laser diodes. The problems cited were interchannel interference, crosstalk, heating, and fluctuation of properties induced to a multichannel LD module which arranged laser diodes without enough margins. For overcoming the problems, ① proposed a four channel laser diode module with four laterally extending lightwaveguides formed on a silicon bench and four laser diodes placed at ends of the lightwaveguides on the silicon bench. The laser diodes are arranged side by side at a wide pitch. The wide separation reduces crosstalk between an LD and a neighboring LD.

FIG. 16 is a perspective view of the LD module proposed by ①. ① has a (100) orientation single crystal silicon bench 222 (or base), lightwaveguides of an $SiO_2$ type formed upon the silicon bench 222, and laser diodes LDa, LDb, LDc and LDd. The lightwaveguides consist of a lower cladding, a core and an upper cladding. The cores are made of Ge-doped $SiO_2$. The lower and upper claddings are made of $SiO_2$. The four channel module has four lightwaveguides A, B, C and D. Front ends of the lightwaveguides have a spatial period (pitch d) of 250 μm which is equal to a pitch of element fibers in standardized ribbon fibers and MT connectors. The lightwaveguides have width enlarging region. Rear ends of the lightwaveguides have a wide spatial period (pitch D) of 1000 μm (1 mm). The four laser diodes LDa, LDb, LDc and LDd are mounted on a rear end 226 of the silicon bench 222 behind the final ends of the lightwaveguides at a 1000 μm pitch.

The known LD module ① expands the pitch of channels from 250 μm, which is equal to the pitch of ribbon fibers, to 1000 μm which is suitable for mounting the four laser diodes. ① multiplies the channel pitch by four. ① reported that crosstalks between the neighboring laser diodes (LDa–LDb, LDb–LDc and LDc–LDd) were −40 dB at 10 GHz. ① gave wide separation between the neighboring laser diodes for suppressing LD—LD mutual crosstalks. Enlargement of the lightwaveguides requires a long enlarging region on the silicon bench. A full length of the silicon bench should be 15 mm to 20 mm. The long silicon bench results in a large, bulky four-channel LD module.

An arrangement of separated, individual laser diode chips at final ends of plural lightpaths in parallel is unavoidable for high speed parallel signal transmission. Separation of the laser diodes enables the module to freely choose p-type substrate LDs or n-type substrate LDs and to select oscillation frequencies of laser diodes independently. Installment of independent laser diodes enhances freedom of designing.

The known reference ① has only a signal transmitting device but lacks a signal receiving device. ① will require a signal receiving device and another ribbon fiber containing another set of four-channel element fibers for establishing a bi-directional simultaneous optical communications system. ① will allocate a common wavelength (e.g., 1.3 μm) in both upward signals and downward signals. An extension of ①, which contains a separated signal transmitting device and a separated signal receiving device, will not be annoyed by crosstalks between the transmitting portion and the receiving portion. The known reference ① requires two (binary) fibers for a single channel. The extension of ① is a binary fiber type system which needs 2M fibers for M channels. Modules for the binary fiber type ① will be expensive, large-sized modules due to an independent LD device and an independent PD device.

The binary fiber system like ① has, in addition, a drawback of laying 2M fibers between a subscriber (ONU) and a central station. In the case of a four channel binary system, eight (4×2=8) element fibers should be built between the ONU and the station, which raises the cost of constructing the system.

A preferable one is a multichannel system which can exchange four channel signals by four fibers by allotting two different wavelengths (e.g., 1.3 μm and 1.55 μm) to an upward signal stream (from ONU to station) and a downward signal stream (from station to ONU). One purpose of the present invention is to provide a bi-directional simultaneous multichannel LD/PD module which can carry signals up and down by a plurality of fibers whose number is equal to the number of channels. Another purpose of the present invention is to provide a bi-directional simultaneous multichannel LD/PD module of low-cost, small-size and high reliability.

There is a known single-fiber LD/PD module, which aims at simultaneous, bi-directional signal transmission of a single channel, positioning a laser diode, a photodiode and a wavelength selective filter at a point of a y-branch formed upon a lightwaveguide layer on a silicon bench in two dimensions. For example, ② Japanese Patent Laying Open No.11-68705, "Two-way WDM optical transmission reception module" proposed a single-channel LD/PD module which has a silicon bench, a y-branched $SiO_2$ lightwaveguide formed on the silicon bench, a laser diode (transmitting 1.3 μm light) deposited at an upper left end of "y", a photodiode (receiving 1.55 μm light) deposited at a bottom end of "y", an end of a fiber fitted at an upper right end of "y", and a WDM (wavelength division multiplexer) at the branch for allowing 1.55 μm light to pass and reflecting 1.3 μm light. On the silicon bench, the 1.3 μm LD beam depicts a V-shaped locus and the 1.55 μm PD beam a /-shaped locus. The known reference ② contrives to reduce electrical crosstalk by positioning the LD and the PD in reverse directions regarding the WDM. Since ②  is a module on an ONU (optical network unit; subscriber), a single-channel is sufficient.

An ONU is satisfied with a module having a single LD (1.3 μm) and a single PD (1.55 μm). The relation of the wavelengths is reversed for an ONU and a station. The central station should be equipped with a station module having an LD which emits 1.55 μm and a PD which senses 1.3 μm. The central station may utilize single-channel modules similar to the module of an ONU. The central station should have N single-channel modules for exchange signals with N ONUs. N, which is a number of ONUs, is a very large number. Installment of N single-channel modules would occupy a vast volume in the central station.

Instead of the single-channel modules, multi-channel modules are favorable for the central station for alleviating the space of installing communication modules at the station. Most of the volume of a module is consumed by benches, packages and cases. PDs, LDs and lightpaths are small elements. A multichannel module, for example, a four channel, eight channel, sixteen channel, or thirty-two channel module, would be made to be a small size nearly equal to a single-channel one. A demand of multichannel modules for station modules occurs. An extension of the teaching of the single-channel ② that couples PDs and LDs to fibers by horizontal, planar y-branches may be a candidate of multichannel modules. The virtual extension model may be called a planar type which connects individual sets of a laser diode and a photodiode by a y-branch on a silicon bench, and would consume a huge space for a plurality of y-branches on the silicon bench. The virtual planar M-channel module would be similar to a series of horizontally aligning M single-channel modules. Such a planar type is insignificant for the purpose of reducing size and cost of station communication modules.

If photodiodes (PDs) were provided near laser diodes (LDs) for the sake of reducing the module size, LD/PD access would raise optical crosstalk and electrical crosstalk between the LDs and the PDs. Large optical, electrical crosstalk prohibits the LD modules from transmitting optical signals simultaneously in bilateral directions. An enough distance should be maintained between the PDs and the LDs in a longitudinal direction and in a lateral direction for suppressing the LD/PD crosstalk.

What is the reason why conventional single-channel bi-directional LD/PD modules should require such a wide two-dimensional extension of, for example, ② Japanese Patent Laying Open No.11-68705 which unifies and divides a transmitting beam and a receiving beam by a y-branch horizontally formed on a silicon bench? The reason causing such a wide extension is that the conventional bi-directional modules two-dimensionally divide and unify two different wavelengths (e.g., 1.3 μm and 1.55 μm) on a common level of the silicon bench. Planar, two-dimensional unification or division of two beams causes such a y-branch which forces a silicon bench to consume a wide area.

Area-consumptive y-branches contradict the requirement of producing small-sized LD/PD modules. ②, which is a single-channel LD/PD module which has a single LD and a single PD, may submit to enlargement of size induced by the planar y-branch. Multichannel transmission will urge LD/PD modules to reduce the size.

A single bi-directional LD/PD module has an intrinsic weak point of electrical crosstalk and optical crosstalk between a laser diode and a photodiode. Access of PD/LD increases the crosstalk. Large crosstalk disturbs optical communications. A photodiode should be far separated from a laser diode for reducing the crosstalk in an LD/PD module. For the purpose, the known reference ② positions the photodiode at the bottom end point of "y" far distanced from the laser diode laid at a top left end of "y". The separation increases the length of the silicon bench. Allotment of a wide planar distance between a laser diode and a photodiode contradicts the purpose of reducing the size of a module.

SUMMARY OF THE INVENTION

Simultaneous exchange of a plurality of signals in two directions imposes the following requirements upon multichannel simultaneous bidirectional LD/PD modules having a plurality of laser diodes and photodiodes.
(1) A sufficient spacing between neighboring laser diodes (LDs).
(2) An enough wide distance between laser diodes (LDs) and photodiodes (PDs).
(3) Low cost, small-size, facile fabrication by planar lightwave circuits.

The present invention proposes a multichannel parallel LD/PD module comprising a bench, a plurality of lightpaths having an initial narrow width region, an intermediate width enlarging region and a final wide width region, a plurality of photodiodes or a photodiode array mounted on the narrow width region, a wavelength selective filter formed on the narrow width region for selectively reflecting receiving beams, and a plurality of light emitting devices fitted behind rear ends of the lightpaths on the bench. Traveling in element fibers from an outer ribbon fiber, receiving signal beams go into the lightpaths via the front ends and are reflected by the wavelength selective filter slantingly upward at the narrow width region. The reflected beams go into the photodiodes and are converted into photocurrents in proportion to the receiving signals. Emanating from the laser diodes, transmitting signal beams enter the lightpaths via the final ends of the wide width region, propagate backward in the enlarging region, arrive at the narrow width region, transfer to outer element fibers in a connector and propagate in the ribbon fiber following the connector.

The multichannel lightpaths are either lightwaveguides or optical fibers. In the case of the optical fibers, a set of the optical fibers should be embedded into curving longitudinal grooves preparatorily perforated on a silicon bench. In the case of the lightwaveguides, cores should be formed by doping a dopant into transparent inorganic $SiO_2$ lightwaveguide layer or an organic polyimide lightwaveguide layer as a cladding.

Smooth expansion of the multichannel lightguides requires a long width enlarging region at an intermediate part of the bench. The narrower initial pitch (spatial period) of the lightpaths is denoted by "d". The wider final pitch of the lightpaths is denoted by "D". An enlarging ratio is given by D/d. A larger ratio D/d demands a longer width enlarging region. The wide space upon the long width enlarging region can be utilized by preparing metallized wirings for photodiodes or installing preamplifiers for amplifying photocurrents of photodiodes.

The transmitting portion can consist of only laser diodes and wirings for the LDs. But in addition, the transmitting portion preferably includes monitoring photodiodes for sensing backward beams from the laser diodes or an LD driving IC for reducing inductance of wirings just behind the laser diodes.

The present invention proposes a multichannel simultaneous bidirectional LD/PD module having the following structure.

(1) The module has a set of multichannel lightpaths (lightwaveguides or optical fibers) which contain an initial narrow width region which has the same pitch as standardized ribbon fibers and connectors, an intermediate curving width enlarging region and a final wide width region for installing light emitting devices (laser diodes or light emitting diodes) with sufficient margins. A enlarging ratio D/d, where d is an initial pitch of the paths in the narrow width region and D is a final pitch of the paths in the wide width region, should be 1.5 to 6. A favorable range of D/d is D/d=2 to D/d=4. A pitch of element fibers in the standardized ribbon fibers is 250 μm. The narrower pitch d should be equal to be 250 μm. The wider pitch D can be D=375 μm to 1500 μm. The curving expanding lightpaths formed upon the bench are either dielectric lightwaveguides or optical fibers. In the case of the lightwaveguides, both inorganic silicon dioxide $SiO_2$ lightwaveguides and organic polyimide lightwaveguides are available.

(2) A wavelength selective filter which selectively reflects only receiving beams from a ribbon fiber slantingly upward is upholstered at an intermediate spot of the initial narrow width region on the bench. Transmitting signal beam frequency is denoted by λ1. Receiving signal beam frequency is denoted by λ2. The wavelength selective filter reflects all λ2 propagating forward from an outer fiber but allows all λ1 emanated from the laser diodes to pass.

(3) A channel number (M) of photodiodes are mounted halfway on the narrow width region on the bench in front of the wavelength selective filter. Signal beams reflected by the wavelength selective filter upward are sensed by the photodiodes. The photodiodes are either M individual photodiodes or a photodiode array containing M elements. The photodiodes array side by side at the narrower pitch d.

(4) A channel number (M) of light emitting devices (laser diodes LDs or light emitting diodes LEDs) are fitted at ends of the lightpaths. The light emitting devices (LDs, or LEDs) align side by side at the longer pitch D. The light emitting devices generate transmitting signal beams and give the beams to the lightpaths.

(5) The width enlarging region of the lightpaths is immune from both laser diodes and photodiodes. Optionally, metallized wirings can be fabricated for connecting the photodiodes with outer circuits on the width enlarging region of the lightpaths. Alternatively, a preamplifier can be mounted on the width enlarging region for amplifying photocurrents of the photodiodes.

(6) Guidepins or guideholes should be fabricated on forefronts of the module or an outer connector for facilitating coupling of the module to the connector.

(7) Monitoring photodiodes can be installed behind the laser diodes for monitoring the LD power and for maintaining the LD power at a constant level. Otherwise, an LD driving IC can be mounted behind the laser diodes.

(8) An LD/PD module is completed by packaging a half-product containing the bench, the LDs, the PDs and the leadframe. An inexpensive package can be provided by resin moulding. For example, low-cost plastic packages are provided by transfermolding half-products with an epoxy resin in a metallic mould.

The standardized tape fiber pitch (250 μm) is smaller than a side (300 μm to 500 μm) of prevalent square laser diodes. Standardized tape fibers which transmit a plurality of signals have too narrow in pitch to mount the laser diodes on any spot of parallel light guides which can couple with the tape fibers. The present invention provides an LD/PD module with a lightpath width enlarging region for enlarging spacings between lightpaths, a narrow lightpath width region for mounting a plurality of light receiving devices thereon, and a wide lightpath width region for installing a plurality of light emitting devices. The lightpath width enlarging region results in giving room for mounting the light receiving/emitting devices. Thus, the invention has the following effects.

(1) The lightpath width enlarging region enables the present invention to produce low-cost, practical, small-sized parallel LD/PD modules which are suitable for directly coupling to standardized tape fibers having a plurality of fibers in parallel with a predetermined pitch (250 μm pitch).

(2) The present invention makes the best use of the lightpath width enlarging region, which might be seemingly a redundant space, as a space for installing photodiodes and producing wiring patterns for the photodiodes. The space is doubly utilized for expanding a lightpath width and for making receiving portions including the photodiodes, which reduces the size and cost of the module. Optionally, preamplifiers can be mounted near the photodiodes on the width expanding region for killing noise and enhancing receiving sensitivity.

(3) The long, wide lightpath width enlarging region, which might be seemingly a useless space, is effective to alleviate electrical, optical and electromagnetic crosstalk between the laser diodes (LDs) and the photodiodes (PDs) by separating the PDs from the LDs with a long interval. Low crosstalk enhances the sensitivity of the signal receiving part.

(4) The laser diodes are furnished with a margin at final ends of the width enlarged lightwaveguides following the lightpath width enlarging regions. The separated laser diodes are individually mounted at the ends of the paths by a sufficient pitch, which alleviates mutual electrical crosstalk between the laser diodes.

(5) The LD/PD module of the present invention can be coupled to a standardized connector, for example, an MT connector by either attaching guidepins or forming guideholes on a forehead of the module. The module has an interface that satisfies the requirements of the standards of optical communications, which ensures facile utility and wide applicability.

(6) Transfermolding half-products with a resin enables the present invention to obtain low-cost, high-reliability, waterproof packages for mass production.

BRIEF DESCRIPTION OF THE DRAWINGS

FIG. 5 is plan view of Embodiment 2 of a parallel LD/PD module having guidepins in front for coupling with an MT connector having guideholes.

FIG. 6 is a sectional side view taken along a plane including a guidepin of a parallel LD/PD module of Embodiment 2 having guidepins on a forefront for coupling with an MT connector with guideholes.

FIG. 7 is a sectional side view taken along a curved plane including a lightpath of a parallel LD/PD module of Embodiment 2 having guidepins on a forefront for coupling with an MT connector with guideholes.

DETAILED DESCRIPTION OF THE PREFERRED EMBODIMENTS

[Embodiment 1 (Basic Type; FIG. 1, FIG. 2, FIG. 3, FIG. 4)]

Figure 1:
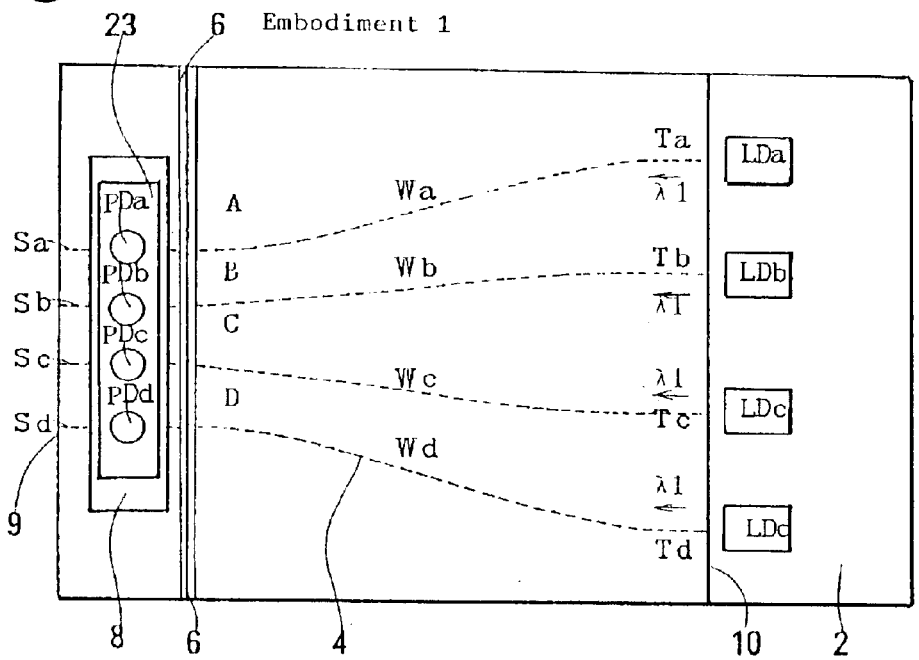
FIG. 1 is a plan view of a silicon bench of Embodiment 1 of a parallel LD/PD module of the present invention.
Figure 2:
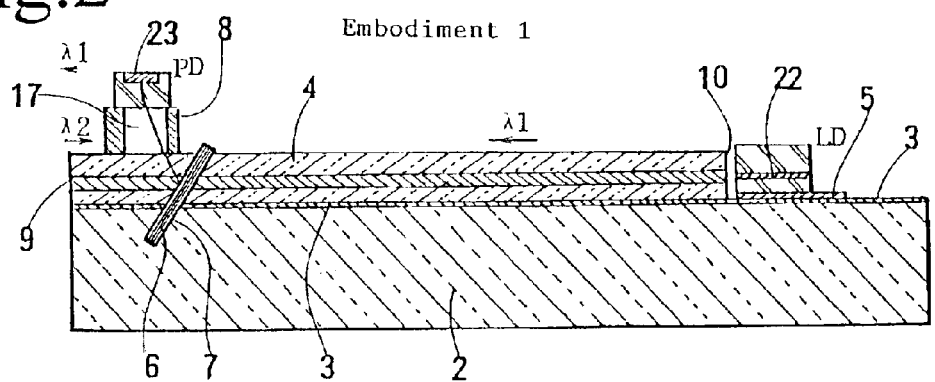
FIG. 2 is a sectional view of a silicon bench of Embodiment 1 of a parallel LD/PD module of the present invention.

FIG. 1 is a plan view of a fabricated substrate of an LD/PD module as Embodiment 1. FIG. 2 is a sectional view of the same. The present invention proposes an LD/PD module having a substrate including a width increasing light guide part, a receiving part with a plurality of photodiodes arranged in a narrower spacing, and a width enlarged transmitting part with a plurality of laser diodes separated with a wider spacing. The light guide part has three parts in a longitudinal direction. An initial one is a narrower spacing part which enables the light guides to axially couple with element fibers of a standardized tape fiber. An intermediate one is a width enlarging part. A final one is a wider spacing part which coincides with a wide spacing of mounting laser diode chips. Photodiodes are installed on the initial narrower spacing part. Laser diodes (LDs) are mounted on the ends of the wider spacing part. The photodiodes are distanced far from the laser diodes. Long separation effectively decreases optical, electromagnetic and electrical crosstalk between the photodiodes and the laser diodes. The distance between the LDs and the PDs should be more than 5 mm. A number M of channels is equal to a number of lightpaths, photodiodes or laser diodes. A favorable channel number M is 4, 8, 16, 32, ..., $2^m$ (m; integer). Here, an LD/PD module of M=4 (M=$2^m$; m=2) is depicted as an example. The lightpaths are either dielectric lightwaveguides or optical fibers. Here, lightwaveguides are shown in the figures. An upper cladding layer and a lower cladding layer are the lightwaveguide layer. M cores sandwiched by the upper and lower claddings are M lightwaveguides which have a refractive index higher than the claddings.

A silicon bench 2 has a thin insulating layer 3, for example, of silicon dioxide ($SiO_2$) on a top surface. A waveguide layer 4 is formed on the top surface. The waveguide layer, which is made of a transparent material, has four width expanding lightpaths (cores) A, B, C and D curvedly extending in a longitudinal direction. The waveguide layer 4 acts as cladding layers with lower refractive index. The cores with a higher refractive index, which are sandwiched between cladding layers, are lightpaths. The waveguide layer 4 covers a front part and an intermediate part of the silicon bench 2.

At a backward part of the silicon bench 2, the insulating layer 3 is exposed without waveguide layer. Metallize pads 5 and wirings, which are not depicted in FIG. 1, are formed on the backward insulating layer 3. Laser diode chips LDa, LDb, LDc and LDd are mounted upon the metallized pads 5.

Lightpaths A, B, C and D have a front narrow width part of Sa, Sb, Sc and Sd, an intermediate width extending part of Wa, Wb, Wc and Wd, and a rear wide width part of Ta, Tb, Tc and Td. The four lightpaths form expanding continual curves Sa-Wa-Ta, Sb-Wb-Tb, Sc-Wc-Tc, and Sd-Wd-Td.

The front narrower part has a narrow spacing which is equal to a pitch of the fibers in a standardized optical connector. Signal detecting photodiodes are mounted on the front narrower part. The intermediate part increases the spacing of the lightpaths by curving the lightpaths with continuity. Sufficient length should be assigned to the intermediate part for preventing sudden curves from occurring. The rear wide width part is a part for coupling with laser diodes (LDs) which require wide spacing. A suitable range of a rate D/d of the wider pitch divided by the narrower pitch is D/d=1.5 to 6. For example, an optimum ratio is D/d=2. A standardized tape fiber has a pitch of 250 $\mu$m(=d). In the standardized tape fiber, the pitch of the wider width part is a 500 μm pitch. The expanding lightpaths enable the module to array laser diodes with a 500 μm pitch in the case.

The lightpaths has the narrow width region Sa, Sb, Sc and Sd at a front part of the bench. The lightpaths has the wide width region of Ta, Tb, Tc and Td at a rear part of the bench. A signal receiving portion is installed halfway at the narrow width region Sa, Sb, Sc and Sd. A signal transmitting portion is laid at the ends of the wide width region Ta, Tb, Tc and Td. Namely, the laser diodes LDa, LDb, LDc and LDd are epi-down (upside down) installed on the insulating layer 3 behind the ends Ta, Tb, Tc and Td. Emanating from the laser diodes, transmitting signal beams go into the lightpaths via the ends Ta, Tb, Tc and Td, run in the lightpaths to the initial ends Sa, Sb, Sc and Sd at the narrow width region, jump into element fibers of a ribbon fiber and propagate in the element fibers.

A wavelength selective filter 6 is embedded into a slanting groove 7 perforated at the initial narrow width region of the lightwaveguide layer 4. The wavelength selective filter 6 has a function of allowing transmitting beams emanating from the laser diodes to pass therethrough and reflecting receiving signal beams slantingly upward. An insulating submount 8 is fixed in front of the wavelength selective filter 6 on the narrow width region. The submount 8 has separated vertical holes and top metallized patterns. A bottom incidence type photodiode array 23 has four photodiode elements PDa, PDb, PDc and PDd on the submount 8 just above Sa, Sb, Sc and Sd of the lightpaths at the narrow width region. For example, the photodiode array 23 having a set of light sensing parts with a diameter of 30 μm to 100 μm on a top of a common crystal substrate at a pitch of 250 μm is employed. Instead of the photodiode array, four independent, individual photodiodes of a side shorter than 250 μm can be utilized.

Four receiving signal beams, which come from element fibers of a ribbon fiber to the narrow ends Sa, Sb, Sc and Sd and propagate in the lightpaths, are reflected by the wavelength selective filter 6 slantingly upward. The four beams go via the vertical holes of the submount 8, enter PDa, PDb, PDc and PDd of the photodiode array 23 and yield photocurrents in proportion to the powers of the signals. No receiving beams attain to the width enlarging region of Wa, Wb, Wc and Wd and the wide width region of Ta, Tb, Tc and Td.

Figure 3:
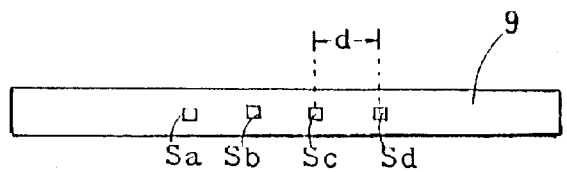
FIG. 3 is a front view of a lightwaveguide layer with four narrow width path ends formed upon the silicon bench of Embodiment 1.

Alternatively, top incidence type photodiodes or photodiode array can be epi-down (upside down) mounted upon the submount 8 instead of the bottom incidence type photodiodes or photodiode array. In this case, separated anodes (p-electrodes) should be joined to separated metallized patterns prepared on the submount. FIG. 3 is a front view of a front end 9 of only the lightwaveguide layer 4. Narrow ends Sa, Sb, Sc and Sd are exposed on the front end 9. The pitch d of the lightpaths is narrow.

Figure 4:
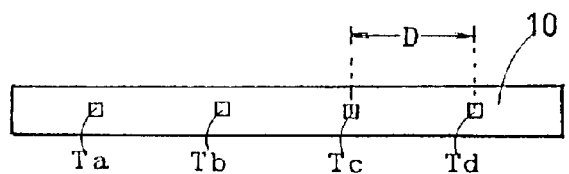
FIG. 4 is a rear view of a lightwaveguide layer with four wide width path ends formed upon the silicon bench of Embodiment 1.

FIG. 4 is a rear view of a rear end 10 of only the lightwaveguide layer 4. Wide ends Ta, Tb, Tc and Td of the lightpaths at the wide width region appear on the rear end 10. The pitch D of the lightpaths is wide. The wide pitch D gives sufficient margins for mounting the laser diodes behind the lightpath ends, which effectively suppresses optical and electrical crosstalk among the laser diodes.

The signal receiving portion (the photodiodes and the wavelength selective filter) is laid upon the narrow width region Sa, Sb, Sc and Sd. The signal transmitting region is installed behind the ends of the wide width region Ta, Tb, Tc and Td. The submount supporting the photodiode array has the vertical holes with the partition walls. The submount suppresses optical crosstalk between the photodiodes or photodiode array and the laser diodes by lifting the photodiode array above the lightpaths. The partition walls prevent optical crosstalk among the photodiode elements. The long distance reduces electromagnetic and optical crosstalk between the photodiodes or photodiode array and the laser diodes.

A large D/d ratio, which favors wide margin mounting of LDs, requires a long width expanding part, which would prolong the length of the silicon bench. An optimum D/d rate should be determined by taking account of economy.

Laser diodes are, in general, squire chips of a side from 300 μm to 500 μm. LD chips of 300 μm×300 μm, in particular, are prevalent. It is impossible to align the 300 μm square LD chips in a 250 μm pitch of the standardized tape fiber. This invention enlarges the pitch of the lightpaths by the width extending part from a narrow pitch d to a larger pitch D, for example, between 375 μm and 1500 μm. For example, assuming D/d=2 and D=500 μm, LDs of a square of 300 μm to 400 μm can be arranged with an enough spacing. InGaAs or InGaAsP type laser diodes are mainly used in optical communications of 1.0 μm band to 1.7 μm band.

A photodiode array of a 250 μm pitch is here employed for the signal receiving part. A light sensing aperture is 30 μm to 100 μm for high speed PDs. Instead of the photodiode array, four small sized square photodiodes of a 200 μm side can be employed in the LD/PD module. Such a narrow sensing aperture of 30 μm to 100 μm enables high speed photodiodes to reduce the size to about 200 μm. The photodiode array has a common cathode (n-electrode) on the bottom and a reverse bias is applied by connecting the common cathode to a power source. Photodiodes having an InGaAs receiving layer or an InGaAsP receiving layer have high sensitivity to nearinfrared wavelengths between 1.0 μm and 1.7 μm.

The submount 8 can be made of a ceramics, e.g., aluminum oxide ($Al_2O_3$). The submount has a top surface with metallized wirings on which cathodes of bottom incidence type photodiodes are bonded. The submount has four vertical holes. Signals running in optical fibers and entering the lightpaths A, B, C and D are reflected by the wavelength selective WDM filter 6 upward via the holes of the submount and are sensed by the signal receiving photodiodes (PDs). The vertical holes are separated by partition walls 17 in the submount 8. The partition walls 17 suppress optical cross talk between the neighboring lightwaveguides. The submount separates the PDs from the lightpaths (lightwaveguides) of the LDs by the height, which reduces optical crosstalk between the PD (receiving part) part and the LD (transmitting part) part. The silicon bench has conductivity which would cause electrical crosstalk. But the submount which is an insulator enables the module of this invention to reduce electrical crosstalk between the LD part and the PD part.

The WDM filter 6 has a wavelength selective function of allowing λ1 light emitted from the LDs to pass and reflecting λ2 receiving light from the optical fibers. The WDM filter is produced by piling two kinds of dielectric films of different refractive indices and different thicknesses by evaporating or sputtering. The WDM is made by piling a set of dielectric films with a function of permitting λ1 (1.3 μm band) to pass and reflecting λ2 (1.55 μm band). In some case, all the M channels have a common transmitting λ1 wavelength and a common receiving λ2 wavelength. In other case, the M channels have slightly different transmitting λ1 (1.3 μm band) wavelengths with a small step of Δ and slightly different receiving $\lambda 2$ (1.55 $\mu$m band) wavelength with a small step of $\Delta$. The transmitting wavelengths are $\lambda 1+j\Delta$ (j=1, 2, . . . , M) and the receiving wavelengths are $\lambda 2 +j\Delta$(j=1, 2, . . . , M). In the case of the common wavelengths, the WDM filter has a uniform layered structure for all channels. In the case of different wavelengths, the WDM filter should have slightly different layered structure for different channels.

[Embodiment 2 (Guidepin; FIG. 5, FIG. 6, FIG. 7)]

The optical communication module of the present invention can be coupled with a standardized connector, for example, an MT connector including an end of a tape fiber which contains a plurality (4, 8, 16 etc.) of parallel fibers aligning by a 250 $\mu$m pitch in a flat resin tape. Guidepins or guideholes are allotted exclusively to either a connector or a module.

FIG. 5 is a plan view of an LD/PD module as Embodiment 2, FIG. 6 is a sectional view of the same taken along a plane including a guidepin, and FIG. 7 is a sectional view of the same taken along a curved plane including a lightpath. Except for guidepins, this module is similar to Embodiment 1.

Embodiment 2 has a rectangular silicon bench 2, a signal receiving portion including width enlarging lightpaths and a plurality of photodiodes or a photodiode array, a signal transmitting portion including a plurality of light emitting devices mounted on the silicon bench 2, and guidepins projecting from a forefront of the silicon bench. The guidepins enable Embodiment 2 to attach to or detach from a connector at a stroke.

The silicon bench 2 has a thin insulating layer 3, for example, a silicon dioxide ($SiO_2$) thereupon. A transparent lightwaveguide layer 4 is formed on the insulating layer 3. Four lightpaths A, B, C and D are made in the lightwaveguide layer 4. The lightwaveguide 4 is a transparent cladding with a lower refractive index. The lightpaths are transparent cores having a higher refractive index. Light signals propagate in the cores A, B, C and D which are called lightpaths. The core is equivalent to the lightpath in the case.

The silicon bench 2 has a rear portion on which metallized pads 5 are made for mounting laser diodes.

The lightpaths A, B, C and D, which are made in the lightwaveguide layer 4, include a front narrow width region of Sa, Sb, Sc and Sd, an intermediate width enlarging region of Wa, Wb, Wc and Wd, and a back wide width region of Ta, Tb, Tc and Td.

Embodiment 2 allots a signal receiving part upon the front narrow width region of Sa, Sb, Sc and Sd and a signal transmitting part at ends of the back wide width region Ta, Tb, Tc and Td. The ends of the lightpaths are exposed on a back end 10 of the lightwaveguide layer 4. Laser diodes LDa, LDb, LDc and LDd are epi-down (upside down) mounted on the metallized pads 5 at the back of Ta, Tb, Tc and Td for directly coupling transmitting light beams of LDa, LDb, LDc and LDd to the lightpaths A, B, C and D.

A slanting groove 7 is formed at the narrow width region of the lightwaveguide layer 4. A wavelength selective WDM (wavelength division multiplexer) filter 6 is inserted into the slanting groove 7. The WDM filter 6 has a function of allowing transmitting beams $\lambda 1$ of the laser diodes to pass without reflection and reflecting receiving beams $\lambda 2$ to the photodiodes without passing. The narrow width region of the lightwaveguide layer 4 is provided with an insulating submount 8 having a plurality of vertical holes. A bottom incidence type photodiode array containing PDa, PDb, PDc and PDd is mounted on a metallized pad of the submount 8.

Emanating from individual fibers of a tape fiber, four receiving beams come into four narrow width lightpaths Sa, Sb, Sc and Sd, are slantingly upward reflected by the WDM filter 6, pass the vertical holes of the submount 8, and go via bottoms into the photodiode array of PDa, PDb, PDc and PDd for generating photocurrents in proportion to the receiving signals. The receiving beams never come into the width enlarging region (Wa, Wb, Wc and Wd) or the wide width region (Ta, Tb, Tc and Td) of the lightpaths.

Embodiment 2 perforates two longitudinal V-grooves 24 at a front portion outside of the lightpaths on the silicon bench 2. Two columnar guidepins 25 are inserted and fixed in the parallel V-grooves 24. The silicon bench, which is a silicon (100) single crystal, enables anisotropic etching to perforate V-grooves of a precise size and exact directions. A half-processed module of Embodiment 2 has a section shown in FIG. 6.

FIG. 5 also shows a horizontal section of an MT connector 27 holding a final end of a four-core tape fiber 28. The MT connector 27 has two parallel guidepin holes 26 on a rear end. The optical fiber has a core and a cladding layer of a 125 $\mu$m diameter. A standardized four-core MT connector aligns four fibers in parallel at a pitch of 250 $\mu$m. The tape fiber 28 envelops four fibers Ha, Hb, Hc and Hd with a resin. The resin layer consists of intermediate parts of a 125 $\mu$m interval and an external part. An end of the tape fiber is maintained in the MT connector 27. The end of the tape fiber coincides with the end of the MT connector. The guidepin holes 26 on the end surface allow the guidepins of the module to pierce through. When the guidepins are inserted into the guidepin holes 26, the element fibers Ha, Hb, Hc and Hd in the MT connector exactly come in tight contact with the light paths Sa, Sb, Sc and Sd respectively at the narrow width region. The guidepins and the holes ensure precise alignment between the MT connector and the LD/PD module.

FIG. 6, which is a sectional view taken in a plane cutting a guidepin, shows a sudden appearance of the lightpath midway in the lightwaveguide layer 4. In FIG. 7, which is a vertical section taken in a plane cutting a lightpath, an allover lightpath horizontally runs in the lightwaveguide layer 4.

Laser diodes LDa, LDb, LDc and LDd make transmitting light signals. The transmitting signals go via the wide width lightpath portions Ta, Tb, Tc and Td into the lightpaths A, B, C and D. The transmitting signals run backward through the width enlarging portions Wa, Wb, Wc and Wd to the narrow width portions Sa, Sb, Sc and Sd. Then, the transmitting signals enter the ribbon fibers Ha, Hb, Hc and Hd at the connector.

On the contrary, receiving light signals going out of the ribbon fibers Ha, Hb, Hc and Hd enter the narrow width parts Sa, Sb, Sc and Sd of the lightpaths A, B, C and D. The receiving signal beams are reflected slantingly upward at the narrow width parts Sa, Sb, Sc and Sd by a wavelength selective filter 6. M receiving beams (here M=4) pass via vertical holes of a submount 8, go into photodiodes PDa, PDb, PDc and PDd and generate photocurrents proportional to the signals in the photodiodes.

Figure 8:
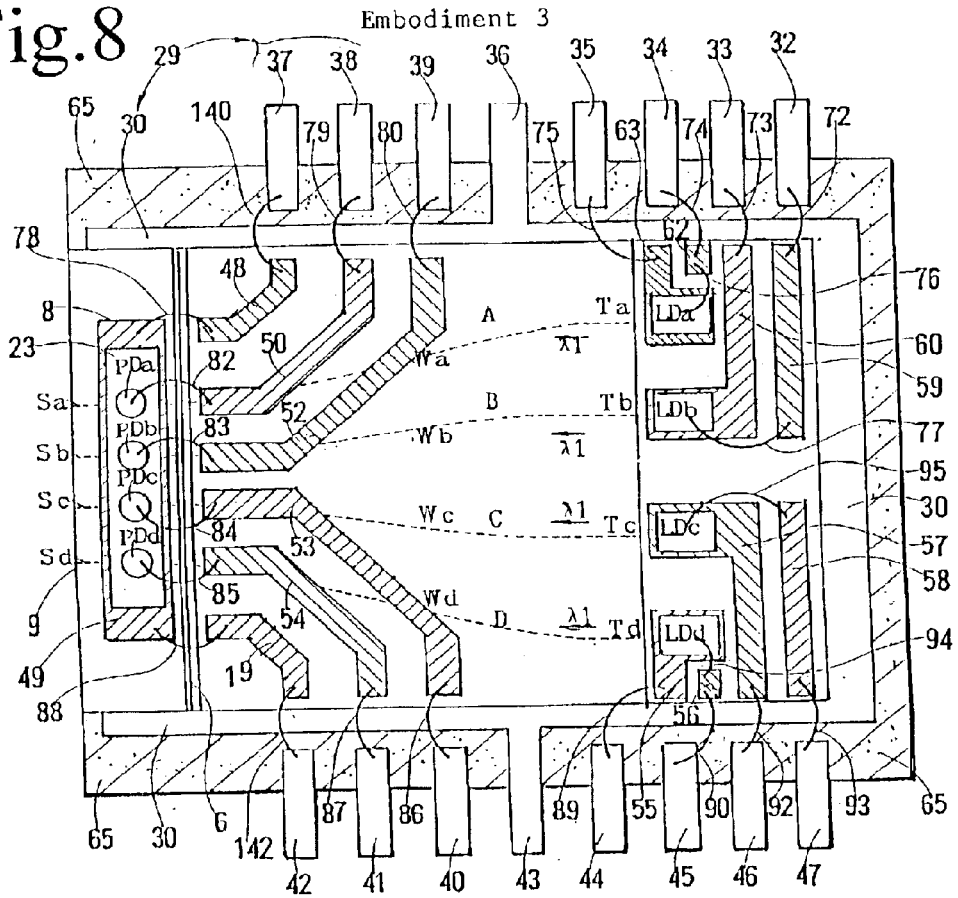
FIG. 8 is a plan view of Embodiment 3 of a parallel LD/PD module having a silicon bench, a lightwaveguide layer, lightpaths, PD metallized patterns on a width enlarging region, LD metallized patterns on a rear end of the silicon bench and a package including the bench, the PDs and LDs.
Figure 9:
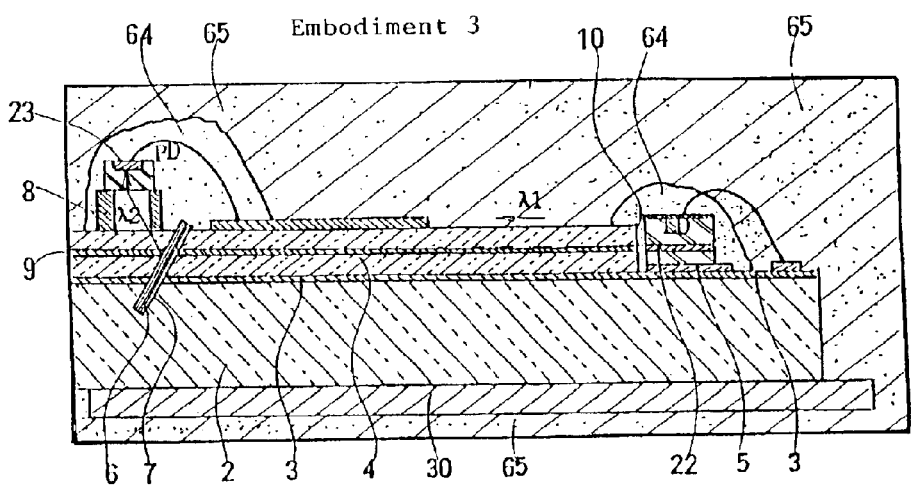
FIG. 9 is a vertically sectioned view of Embodiment 3 of a parallel LD/PD module having a silicon bench, a lightwaveguide layer, lightpaths, PD metallized patterns on a width enlarging region, LD metallized patterns on a rear end of the silicon bench and a package including the bench, the PDs and LDs.

[Embodiment 3 (Wiring on Enlarging Region, Leadframe; FIG. 8, FIG. 9)]

This invention allocates a sufficient length to the width enlarging region for enlarging a spatial period moderately without power loss. Thus, the enlarging region has a wide extra surface which is favorably insulated by a top lightwaveguide layer. Embodiment 3 utilizes the width enlarging region for forming metallized patterns and metallized wirings for photodiodes thereon. And this mode uses a leadframe which is installed under a silicon bench. FIG. 8 is a plan view of an LD/PD module of this mode including a package and the metallized patterns and wirings are shown there. Metallized patterns and wirings are indispensable for Embodiments 1 and 2 like this mode. FIG. 9 is a sectional view of this module.

Embodiment 3 has a silicon bench 2, a plurality of curving lightpaths formed upon the silicon bench, which has a narrow width region, a width enlarging region and a wide width region, a signal receiving (PD) part with a plurality of photodiodes or a photodiode array, a signal transmitting (LD) part with a plurality of laser diodes, PD wiring patterns formed upon the width enlarging region, LD wiring patterns formed upon a rear end of the silicon bench, and a leadframe fitted on a bottom of the silicon bench.

A thin insulating layer 3, for example, a silicon dioxide ($SiO_2$) layer is formed upon the silicon bench 2. The insulating layer 3 is coated with a transparent light-waveguide layer 4. Four lightpaths A, B, C and D for guiding signal light beams are made in the lightwaveguide layer 4.

The lightpaths A, B, C and D prepared in the lightwaveguide layer 4 consist of narrow width parts Sa, Sb, Sc and Sd, width enlarging parts Wa, Wb, Wc and Wd and wide width parts Ta, Tb, Tc and Td.

The narrow width parts are provided with PD parts. A rear end of the silicon bench 2 behind the wide width parts are provided with LD parts. Ends of the lightpaths Ta, Tb, Tc and Td appear on a rear end 10 of the lightwaveguide layer 4. Laser diodes LDa, LDb, LDc and LDd are epi-down (upside down) mounted on metallized patterns of the rear end of the silicon bench. The laser diodes LDa, LDb, LDc and LDd are coupled to rear ends of the lightpaths A, B, C and D.

The narrow width parts are obliquely cut by a slanting groove 7. A wavelength selective filter 6 is inserted in the slanting groove 7. The wavelength selective filter 6 plays a role of reflecting receiving light $\lambda 2$ and allowing transmitting light $\lambda 1$ to pass therethrough. A submount 8 with vertical holes and a top metallized pattern 49 are fitted in front of the wavelength selective filter 6 on the narrow width region. A bottom incidence type photodiode array 23 including individual PD parts PDa, PDb, PDc and PDd is mounted on the submount 8 via the metallized pattern 49.

A leadframe 29, which has an outer frame, many leadpins and wiring patterns made by cutting a thin metallic plate, is bonded on the bottom of the silicon bench 2. The leadframe 29 has the outer frame (not shown in the figures), a plurality of leadpins 32–47, ground leads 36 and 43 and a base metal 30 supported by the ground leads 36 and 43. The leadpins 32–47 and the base metal 30 lie at the same height as the bottom of the silicon bench 2.

Embodiment 3 provides the width enlarging region with wirings for the photodiode array 23 which includes individual photodiode devices PDa, PDb, PDc and PDd. A metallized pattern 49 for the photodiode cathodes is made upon the submount 8. The on-submount pattern 49 is connected by wires 78 and 88 to metallized patterns 48 and 19 respectively. The metallized patterns 48 and 19 are joined by wires 140 and 142 to the leadpins 37 and 42 respectively. The leadpins 37 and 42 should be connected to a power source or a definite positive voltage for allotting a reverse bias upon n-electrodes (cathodes) of the photodiodes.

Metallized patterns 48, 50, 52, 53, 54 and 19 are prepared upon the enlarging region of the lightwaveguide layer by printing or evaporation. The figures specify metallized patterns by hatching (parallel slanting lines), which does not mean sections. Anodes (p-electrodes) of the photodiodes PDa, PDb, PDc and PDd are joined via wires 82, 83, 84 and 85 to metallized patterns 50, 52, 53 and 54. Photocurrents flowing in the anodes are receiving signals. Wiring patterns 50, 52, 53 and 54 are connected by wires 79, 80, 86 and 87 to leadpins 38, 39, 40, and 41 respectively.

The insulating layer 3 at the back of the waveguide layer 4 on the silicon bench 2 has metallized patterns 55, 56, 57, 58, 59, 60, 62 and 63 which are formed by printing or evaporation for mounting laser diodes LDa, LDb, LDc and LDd thereupon. The metallized patterns 55–60 and 62–63 correspond to the metallized patterns 5 in Embodiments 1 and 2.

LDa is mounted upon the metallized pattern 63. LDb is fitted upon the metallized pattern 60. LDc is installed upon the metallized pattern 57. LDd is laid upon the metallized pattern 55. The laser diodes LDa, LDb, LDc and LDd are epi-down (upside down) mounted on the metallized patterns. Stripes (p-electrodes or anodes) are directly soldered to the metallized patterns.

Tops of the laser diodes have cathodes (n-electrode or bottom electrodes) which cover allover or partially the tops. A wire 76 connects a cathode of LDa to a metallized pattern 62. A wire 77 couples a cathode of LDb to a metallized pattern 59. A cathode of LDc is connected to a metallized pattern 58 by a wire 95. A cathode of LDd is coupled to a metallized pattern 56 by a wire 94.

A wire 74 connects the metallized pattern 62 of LDa to a leadpin 34. Another wire 72 couples the metallized pattern 59 of LDb to a leadpin 32. The metallized pattern 58 of LDc is connected to a leadpin 47 by a wire 93. The metallized pattern 56 of LDd is coupled to a leadpin 45 by a wire 90.

The leadpins are laid at a different height from the metallized patterns on the lightwaveguides. The wires connect two spots at different heights.

After wire-bonding and chip-mounting, a transparent, elastic resin 64 having a refractive index nearly equal to a refractive index of the lightwaveguides is supplied to the LDs, the PDs, the ends of the lightwaveguides and other parts which exchange light signals. A suitable transparent resin is a silicone resin or an acrylate resin. Since the transparent resin has a refractive index similar to the lightwaveguides, random scattering and reflection at the ends of the lightwaveguides are reduced. Filling the inner holes of the submount 8, the transparent resin 64 guides the beams reflected by the WDM 6 into the PDs without scattering. The transparent resin plays a role of leading the transmitting beams emanating from the LDa, LDb, LDc and LDd to the widened ends Ta, Tb, Tc and Td without random reflection or scattering. The transparent resin has a function of protecting the photodiodes or the laser diodes from external shocks.

The half-products are further enclosed by a hard, opaque resin 65, optionally including a pigment. The resin becomes a rigid, air-tight plastic package. The packages are made by transfermolding a material resin with the half-products in a metallic mould at a stroke. The molded packages are inexpensive, reliable packages suitable for large-scale production.

Transmitting beams ($\lambda 1$) emitted from the laser diodes LDa, LDb, LDc and LDd go into the wider width ends Ta, Tb, Tc and Td and propagate in the curved parts Wa, Wb, Wc and Wd of the lightwaveguides A, B, C and D. Then, the transmitting beams enter the individual fibers in a tape fiber from the narrower front ends Sa, Sb, Sc and Sd and propagate in outer fibers to a counterpart node.

On the contrary, receiving beams ($\lambda 2$) which come from the tape fiber go into the narrower ends Sa, Sb, Sc and Sd and are reflected slantingly upward by the WDM filter 6. Passing the vertical holes of the submount 8, the receiving beams go into partial photodiodes PDa, PDb, PDc and PDd of the photodiode array 23 for making photocurrents which represent receiving signals. The receiving beams go neither to the width enlarging region nor to the wide width region.

Embodiment 3 can be directly connected to a tape fiber by a pertinent coupling contrivance. Like Embodiment 2, Embodiment 3 can be coupled to an MT connector by providing holes or guidepins either to the module or to the MT connector exchangeably.

Figure 10:
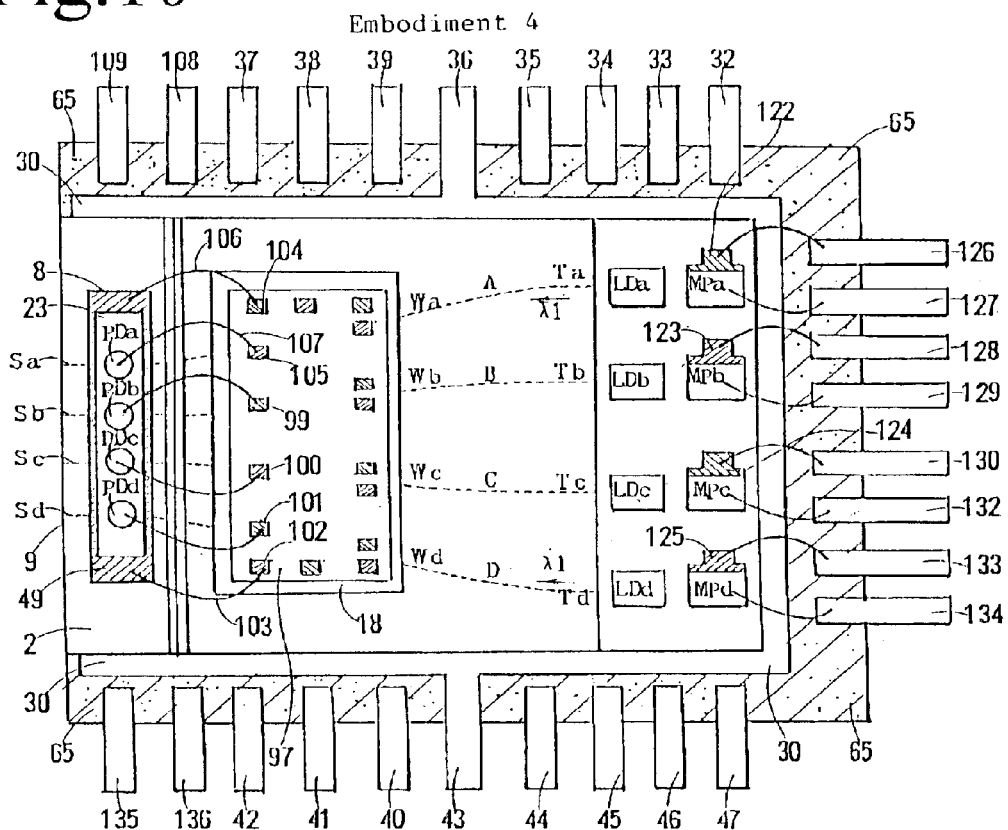
FIG. 10 is a plan view of Embodiment 4 of a parallel LD/PD module having a silicon bench, a lightwaveguide layer, lightpaths, PD metallized patterns on a width enlarging region, LD metallized patterns on a rear end of the silicon bench, a submount on the width enlarging region, a preamplifier mounted upon the submount, monitoring photodiodes behind the LDs for monitoring power of the LDs and a package.
Figure 11:
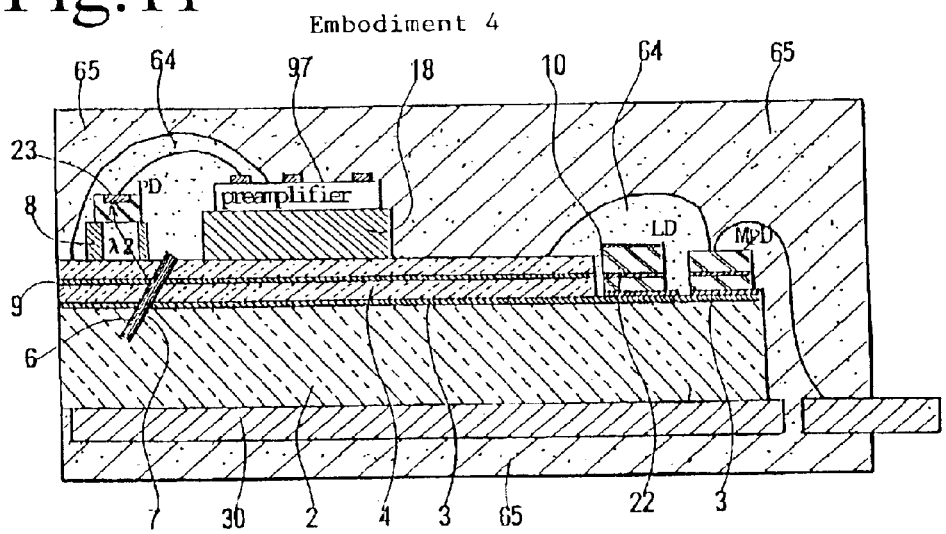
FIG. 11 is a vertically sectioned view of Embodiment 4 of a parallel LD/PD module having a silicon bench, a lightwaveguide layer, lightpaths, PD metallized patterns on a width enlarging region, LD metallized patterns on a rear end of the silicon bench, a submount on the width enlarging region, a preamplifier mounted upon the submount, monitoring photodiodes behind the LDs for monitoring power of the LDs and a package.

[Embodiment 4 (Preamplifier, Monitoring PD; FIG. 10, FIG. 11)]

A surface of the width enlarging part can be effectively utilized by installing a preamplifier, which preamplifies photocurrents of photodiodes, on the width enlarging region. Photocurrents of the photodiodes, which are feeble and of high-impedance, are subject to external noise or electric noise from LDs. To avoid the noise, it is preferable to allocate a preamplifier for amplifying the photocurrents at a spot close to the photodiodes. The noise is reduced by preamplifying the photocurrents just yielded by the photodiodes and by taking out amplified signals with a lower impedance.

FIG. 10 is a plan view of an LD/PD module of Embodiment 4 including a package. FIG. 11 is a sectional view of Embodiment 4 contained in the package.

The Embodiment 4 module is built upon a silicon bench 2. A thin insulating layer 3, e.g., silicon dioxide $SiO_2$, is formed on the silicon bench 2. A transparent lightwaveguide layer 4 is formed upon the insulating layer 3. Four lightpaths A, B, C and D are produced in the lightwaveguide layer 4.

The lightpaths A, B, C and D have three different regions. A first one is a narrow width region containing narrower spacing paths Sa, Sb, Sc and Sd. A second one is a width enlarging region containing spacing growing paths Wa, Wb, Wc and Wd. A third one is a wide width region having wider width paths Ta, Tb, Tc and Td.

A first submount 8 with vertical holes is mounted upon the initial narrow width region of the lightpaths Sa, Sb, Sc and Sd. A second wide submount 18 is furnished upon the middle spacing enlarging region of Wa, Wb, Wc and Wd for installing a preamplifier which preamplifies photocurrents of photodiodes. An LD part (transmitting part) has laser diodes and monitoring photodiodes which are upholstered upon the end of the silicon bench at the back of the wide width lightpath region.

A slanting groove 7 is formed midway at the narrow width region on the lightwaveguide. A wavelength selective filter 6 is inserted and fixed in the slanting groove 7. The wavelength selective filter 6 plays a role of reflecting the receiving beams from the fibers upward slantingly but allowing the transmitting beams from the laser diodes to pass therethrough.

The second wide submount 18, which is mounted upon the lightpath enlarging region, sustains a preamplifier 97. The preamplifier 97 is either a one-power source type or a binary-power source type. A one-power source preamplifier should have four pins, i.e., a source pin, a ground pin, an input pin and an output pin. A binary power source preamplifier should have five pins, that is, a +source pin, a −source pin, a ground pin, an input pin and an output pin.

Here, the single preamplifier 97 which acts upon the four photodiodes in common is shown in FIG. 10. Alternatively, four independent preamplifiers can replace the single preamplifier 97. The first narrower submount 8 has a top metallized pad 49. An photodiode array 23 having a PDa part, a PDb part, a PDc part and a PDd part is fitted upon the top metallized pad 49 of the submount 8. Otherwise, the photodiode array 23 can be replaced by four individual photodiodes. Sixteen pads are prepared upon the preamplifier 97, which are sufficient for a single-power source preamplifier. The sixteen pads are sufficient even for a binary power source type preamplifier by common use of source pads. The metallized pad 49 (cathode of the photodiode array 23) is connected by wires 106 and 103 to pads 104 and 102 of the preamplifier 97. An anode of PDa is joined to an input pad 105 of the preamplifier by a wire 107. Other pads of PDa are a ground pad or an output pad. Other three PDs have a similar set of pads. Installing of the preamplifier 97 causes an addition of leadpins 108, 109, 135 and 136 on both sides of the module.

Laser diodes LDa, LDb, LDc and LDd are upside down (epi-down) mounted on metallized patterns at the back of lightpath ends Ta, Tb, Tc and Td appearing on a rear end 10 of the lightwaveguide layer 4. The metallized patterns for the LDs are described in Embodiment 3 and are omitted here. The LDs of this mode emit light forward and backward. Behind the LDs, metallized patterns 122 to 125 are made on the insulating layer 3 and monitoring photodiodes MPa, MPb, MPc and MPd are respectively installed on the patterns 122 to 125. The monitoring PDs plays a role of sensing backward light of the LDs, monitoring output power of the LDs, increasing or decreasing driving currents of the LDs, and keeping the output power constant. Leadpins 126 to 130 and 132 to 134 are added to the module for wiring of the monitoring PDs.

A transparent elastic resin 64 is supplied to the laser diodes, the photodiodes, and the lightwaveguides which exchange optical signals for ensuring lightpaths. A halfproduct covered with the transparent resin 64 is transfermolded in a metallic die with another hard opaque resin 65, which is similar to Embodiment 3.

Figure 12:
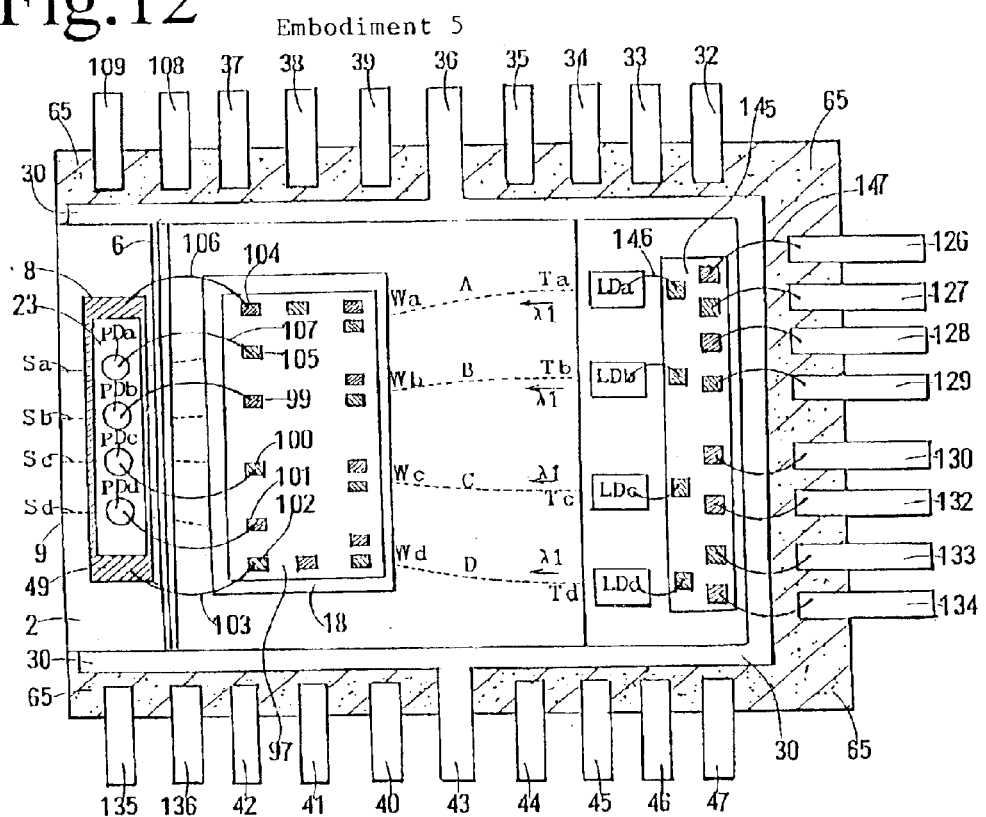
FIG. 12 is a plan view of Embodiment 5 of a parallel LD/PD module having a silicon bench, a lightwaveguide layer, lightpaths, PD metallized patterns on a width enlarging region, LD metallized patterns on a rear end of the silicon bench, a submount on the width enlarging region, a preamplifier mounted upon the submount, an LD driving IC for driving the LDs on the rear end of the silicon bench, and a package containing the silicon bench, the PDs, the LDs, the preamplifier and the LD driving IC.
Figure 13:
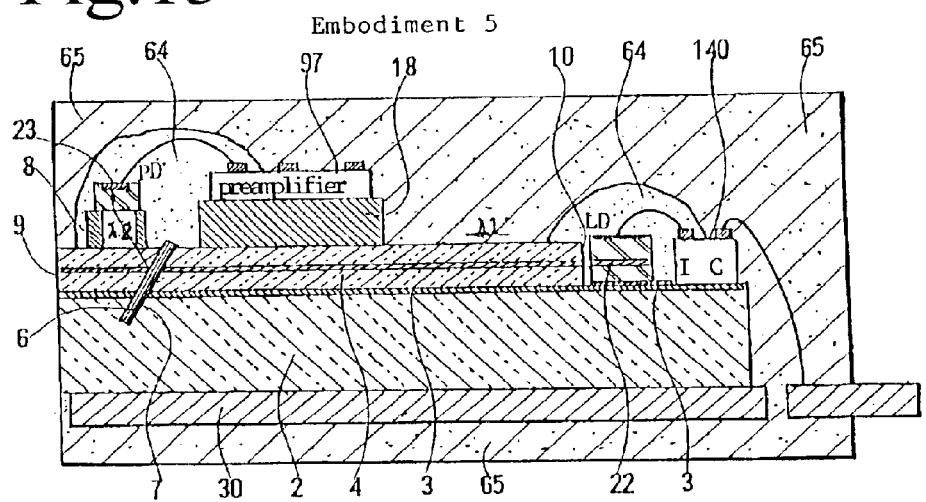
FIG. 13 is a vertically sectioned view of Embodiment 5 of a parallel LD/PD module having a silicon bench, a lightwaveguide layer, lightpaths, PD metallized patterns on a width enlarging region, LD metallized patterns on a rear end of the silicon bench, a submount on the width enlarging region, a preamplifier mounted upon the submount, an LD driving IC for driving the LDs on the rear end of the silicon bench, and a package containing the silicon bench, the PDs, the LDs, the preamplifier and the LD driving IC.

[Embodiment 5 (Preamplifier on Enlarging Region, LD Driving IC; FIG. 12, 13)]

Embodiment 5 provides laser diodes LDa, LDb, LDc and LDd with a driving IC 145 instead of the monitoring photodiodes MPa, MPb, MPc and MPd of Embodiment 4. Introduction of the LD driving IC enables the laser diodes to act faster than Embodiment 4 by reducing inductances L and resistances R of wirings connecting the driving circuits and the laser diodes. Shortening of the wirings allows the LD/PD module to drive the laser diodes LDa, LDb, LDc and LDd at a speed higher than 1 Gbps (giga bits per second) via the reduction of the inductances of the wirings. Embodiment 5 mounts a preamplifier 97 on the enlarging region of the lightpaths for preamplifying photocurrents of photodiodes like Embodiment 4.

Figure 14:
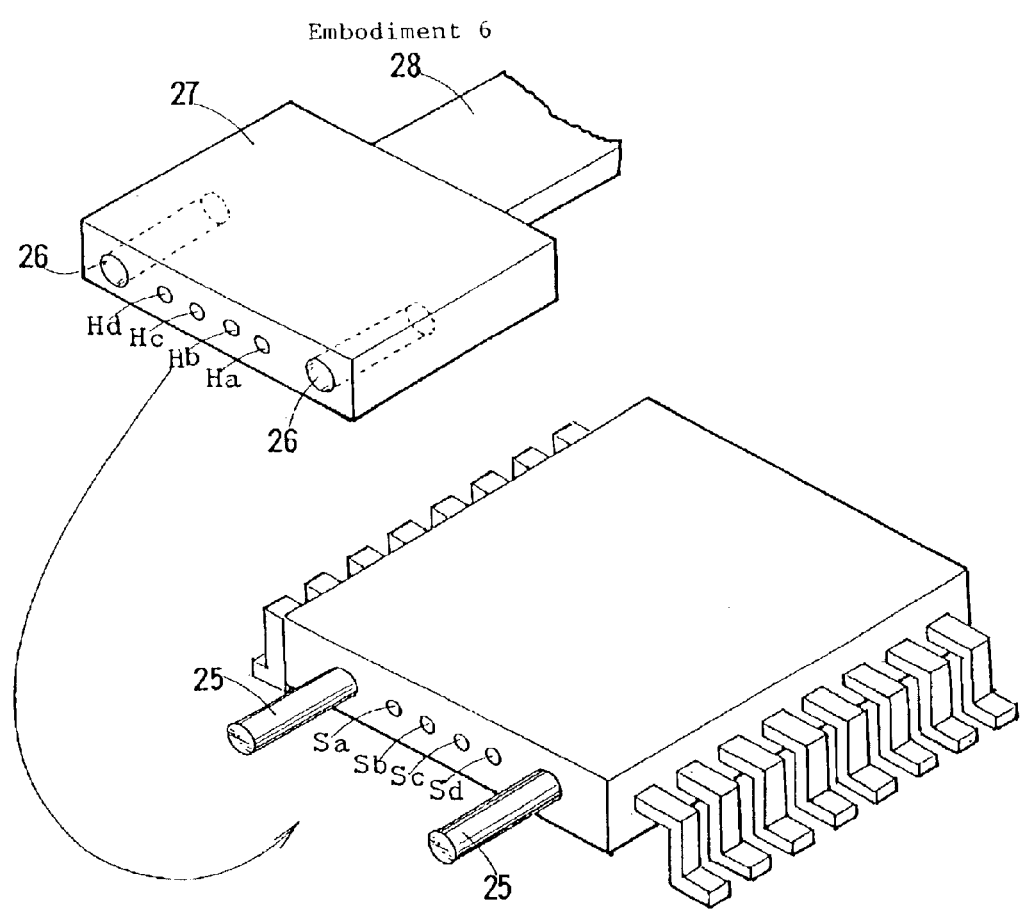
FIG. 14 is a perspective view of a parallel LD/PD module with guidepins and an MT connector with guideholes.

[Embodiment 6 (Coupling to MT Connector, Guidepin on Module; FIG. 14)]

Embodiment 2 proposed a coupling mode of an LD/PD module with guidepins and an MT connector with guideholes. FIG. 14 shows Embodiment 6 having the same coupling mode of a module and an MT connector, which maintains a four-core ribbon fiber. Alternatively, another MT connector having eight cores or sixteen cores is also available.

Guideholes 26 are perforated in a longitudinal direction on a front end of an MT connector 27. Ends of element fibers Ha, Hb, He and Hd are exposed on the front of the MT connector 27 at a 250 $\mu$m pitch.

Guidepins 25 project on a front end of a module. Ends of narrow width lightpaths Sa, Sb, Sc and Sd appear on the front of the module at a 250 $\mu$m pitch in coincidence with the fiber pitch. When the guidepins 25 of the module are inserted into the guideholes 26 of the MT connector 27, the ends Ha, Hb, He and Hd of the MT connector are in contact with the ends Sa, Sb, Sc and Sd of the lightpaths of the module for exchanging light signals between the ribbon fiber and the module. Such a connection mode (hole-connector & pin-module) can be applied to Embodiments 1, 3, 4 and 5.

Figure 15:
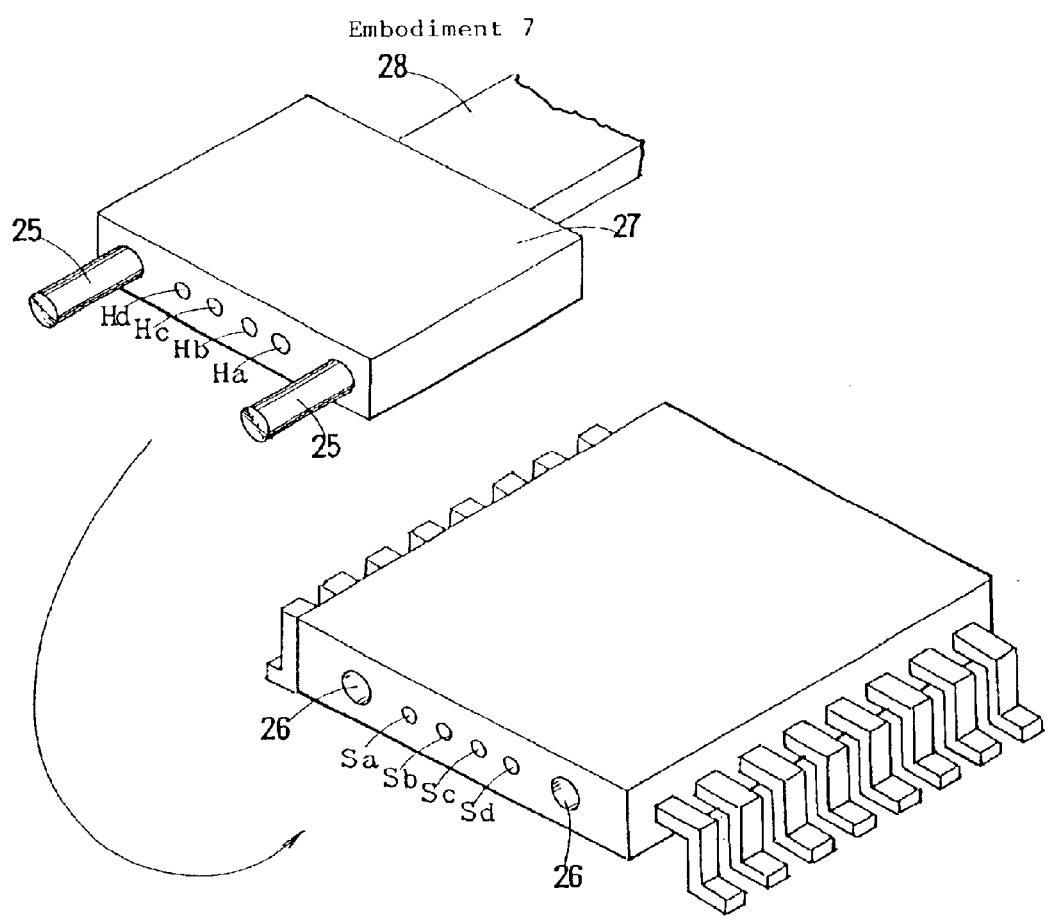
FIG. 15 is a perspective view of a parallel LD/PD module with guideholes and an MT connector with guidepins.
Figure 16:
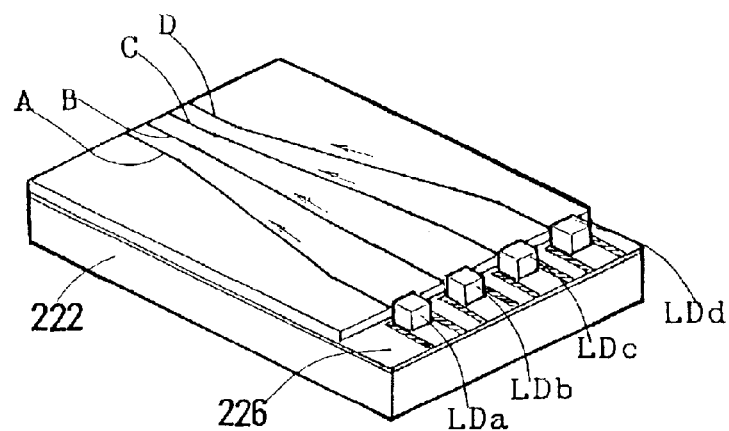
FIG. 16 is a perspective view of a 4ch parallel LD module proposed by ①M. Shishikura, K. Nagatsuma, T. Ido, M. Tokuda, K. Nakahara, E. Nomoto, T. Sudoh and H. Sano, "10 Gbps×4-channel parallel LD module", Proceeding of the 2001 Communications Society Conference of IEICE, C-3-50, p160 (2001).
Figure 17:
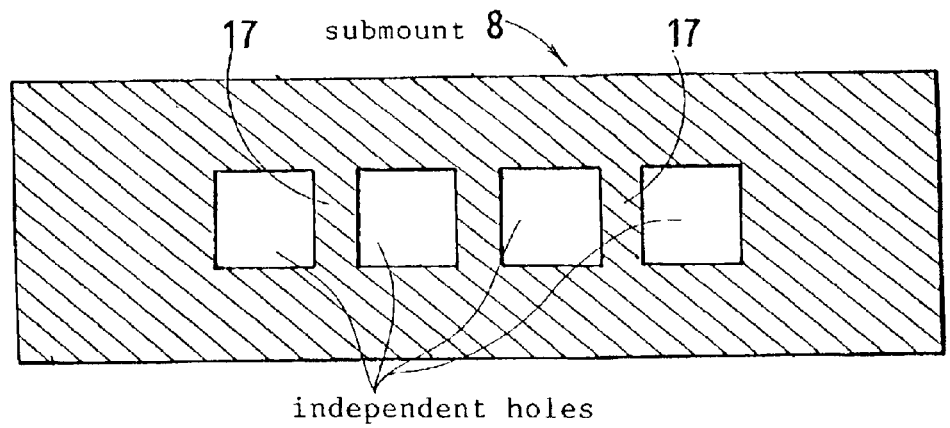
FIG. 17 is a horizontally sectioned view of a submount with vertical independent holes which supports photodiodes. The independent holes suppress crosstalk among the photodiodes.

[Embodiment 7 (Coupling to MT Connector, Guidepin on Connector; FIG. 15)]

FIG. 15 shows Embodiment 7 having an MT connector 27 with guidepins 25 and a module with guideholes 26. This mode is also available for exchanging light signals between a ribbon fiber and the module. This connection mode (hole-module & pin-connector) can be also applied to Embodiments 1, 3, 4 and 5.

Two guidepins 25 project forward in parallel from a front of the MT connector 27. Front ends of fibers Ha, Hb, He and Hd appear at a 250 μm pitch on a flat front surface of the MT connector.

The module has two guidepin holes 26 on an end surface in parallel for coupling with the MT connector. Narrow width ends Sa, Sb, Sc and Sd, which have a 250 μm pitch for coupling to a tape fiber, of lightwaveguides are exposed at a front end between the guidepin holes. Inserting the guidepins 25 to the guidepin holes 26 couples the module to the connector. The fibers Ha, Hb, He and Hd of the connector face to the lightwaveguide cores Sa, Sb,Sc and Sd of the module without gap at the interface for exchanging optical signals between the connector fibers and the module waveguide cores. Such a coupling (guidepins & holes) can be applied to Embodiments 1, 3, 4 and 5.

[Embodiment 8 (Optical Fiber Lightpath)]

The aforementioned embodiments form a plurality of lightwaveguides of a polyimide type or an $SiO_2$ type on a silicon bench for guiding light. Instead of the lightwaveguides, a set of a plurality of optical fibers can be employed for making equivalent lightpaths. M curved V-grooves with a narrow width part, an intermediate enlarging part and a wider width part are formed on the silicon bench for burying and fixing optical fibers with an adhesive. Preparatory V-groove formation enables the fibers to determine preferable curvatures with accuracy. Front ends of the fibers Sa, Sb, Sc and Sd should be finished at the same height as a package surface by polishing.

What is claimed is:

1. A parallel light emitting device—photosensitive device module comprising:
   a bench;
   a plurality of lightpaths having a narrow width region with initial ends of a narrower pitch d, a width enlarging region, and a wide width region with final ends of a wider pitch D and being formed on the bench;
   a plurality of light emitting devices mounted behind rear ends of the lightpaths at the wide width region for generating transmitting signal beams;
   a plurality of photodiodes or a photodiode array fitted upon the narrow width region for sensing receiving signal beams;
   a wavelength selective device formed at the narrow width region for reflecting the receiving signal beams propagating in the lightpaths from the initial ends upward to the photodiodes or the photodiode array and allowing the transmitting signal beams emanating from the light emitting devices to pass through.

2. The parallel light emitting device—photosensitive device module according to claim 1, wherein the lightpaths are optical fibers embedded in curving grooves perforated on the bench.

3. The parallel light emitting device—photosensitive device module according to claim 1, wherein the lightpaths are curving lightwaveguides made upon the bench.

4. The parallel light emitting device—photosensitive device module according to claim 3, wherein the wavelength selective device is a wavelength selective filter embedded in a groove on the narrow width region on the bench for reflecting the receiving signal beams propagating in the lightpaths from the initial ends.

5. The parallel light emitting device—photosensitive device module according to claim 4, wherein the photodiodes or the photodiode array is a bottom incidence type which receives light entering from a bottom surface of the photodiodes or the photodiode array.

6. The parallel light emitting device—photosensitive device module according to claim 5, wherein metallized wirings and metallized patterns for connecting the photodiodes or the photodiode array to outer circuits are made upon the width enlarging region of the lightpaths on the bench.

7. The parallel light emitting device—photosensitive device module according to claim 5, wherein a submount having vertical holes with partitions mounted on the narrow width region in front of the wavelength selective filter for supporting the photodiodes or the photodiode array on a top.

8. The parallel light emitting device—photosensitive device module according to claim 7, wherein the light emitting devices are separated, individual laser diodes mounted behind the rear ends of the lightpaths at the wide width region.

9. The parallel light emitting device—photosensitive device module according to claim 7, wherein a preamplifier is installed upon the width enlarging region of the lightpaths on the bench for amplifying photocurrents of the photodiodes or the photodiode array.

10. The parallel light emitting device—photosensitive device module according to claim 7, wherein metallized wirings and metallized patterns for connecting the photodiodes or the photodiode array to outer circuits are made upon the submount.

11. The parallel light emitting device—photosensitive device module according to claim 7, wherein the light emitting devices are separated, individual light emitting diodes mounted behind the rear ends of the lightpaths at the wide width region.

12. The parallel light emitting device—photosensitive device module according to claim 8, wherein the laser diodes emit a forward beam and a backward beam, the forward beams go into the lightpaths via the final ends, the backward beams go into monitoring photodiodes mounted behind the laser diodes for monitoring power of the laser diodes.

13. The parallel light emitting device—photosensitive device module according to claim 8, wherein the bench, the photodiodes or photodiode array, the light emitting devices and the wavelength selection device are contained in a package, and wherein the module further comprises guideholes formed on a forefront of the package for attaching to or detaching from an outer optical connector maintaining a plurality of element fibers with guidepins.

14. The parallel light emitting device—photosensitive device module according to claim 8, wherein the bench, the photodiodes or photodiode array, the light emitting devices and the wavelength selection device are contained in a package, and wherein the module further comprises guidepins projecting from a forefront of the package for attaching to or detaching from an outer optical connector maintaining a plurality of element fibers with guideholes.

15. The parallel light emitting device—photosensitive device module according to claim 14, wherein a number of the lightpaths is $2^m$ (m; integer), the narrower pitch d of the lightpaths is 250 μm and the guidepins satisfy requirements of standardized MT connectors.

16. The parallel light emitting device—photosensitive device module according to claim 15, further comprising a leadframe having leadpins and being fixed to the bench.

17. The parallel light emitting device—photosensitive device module according to claim 16, wherein the bench, the photodiodes or the photodiode array, the light emitting devices, the wavelength selective filter, the metallized wirings and metallized patterns are enclosed by a resin molding package.

18. The parallel light emitting device—photosensitive device module according to claim 17, wherein a ratio D/d of the wider pitch to the narrower pitch of the lightpaths on the bench is 1.5 to 6.

19. The parallel light emitting device—photosensitive device module according to claim 18, wherein a transparent resin covers the vertical holes of the submount under the photodiodes or the photodiode array and parts which exchange light signals between chips and the chips and the lightpaths.

20. The parallel light emitting device—photosensitive device module according to claim 8, wherein an LD driving IC is mounted on a rear region of the bench without the lightpaths for driving the laser diodes.

* * * * *